United States Patent
Tatcho et al.

(10) Patent No.: US 9,389,270 B1
(45) Date of Patent: *Jul. 12, 2016

(54) METHOD OF LOCATING A FAULT IN A POWER DISTRIBUTION SYSTEM COMPRISING AT LEAST ONE DISTRIBUTED RESOURCE HAVING A CONTROLLABLE VOLTAGE SOURCE CONVERTER

(71) Applicant: The Florida State University Research Foundation, Inc., Tallahassee, FL (US)

(72) Inventors: Passinam Tatcho, Tallahassee, FL (US); Mischa Steurer, Crawfordville, FL (US); Hui Li, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/962,820

(22) Filed: Dec. 8, 2015

Related U.S. Application Data

(63) Continuation of application No. 14/166,467, filed on Jan. 28, 2014, now Pat. No. 9,274,161.

(60) Provisional application No. 61/757,507, filed on Jan. 28, 2013.

(51) Int. Cl.
*G01R 31/14* (2006.01)
*G01R 31/08* (2006.01)
*G01R 31/40* (2014.01)
*H02J 1/00* (2006.01)
*G01R 31/00* (2006.01)

(52) U.S. Cl.
CPC .............. *G01R 31/086* (2013.01); *G01R 31/40* (2013.01); *G01R 31/00* (2013.01); *G01R 31/088* (2013.01); *H02J 1/00* (2013.01); *H02J 2001/002* (2013.01); *H02J 2001/004* (2013.01); *H02J 2001/006* (2013.01); *H02J 2001/008* (2013.01)

(58) Field of Classification Search
CPC ..... G01R 31/086; G01R 31/088; G01R 31/00; G01R 31/40; H02J 2001/002; H02J 2001/004; H02J 2001/006; H02J 2001/008; H02J 1/00
USPC .................................. 324/509, 522, 523, 527
See application file for complete search history.

(56) References Cited

U.S. PATENT DOCUMENTS

| | | |
|---|---|---|
| 2010/0102824 A1 | 4/2010 | Tremblay et al. |
| 2012/0091817 A1 | 4/2012 | Seymour et al. |
| 2012/0271470 A1 | 10/2012 | Flynn et al. |

OTHER PUBLICATIONS

Tatcho et al. "A Real Time Digital Test bed for a Smart Grid using RTDS", IEEE International Symposium on Power Electronics for Distributed Generation Systems, pp. 658-661, 2010.*

(Continued)

*Primary Examiner* — Farhana Hoque
(74) *Attorney, Agent, or Firm* — Molly L. Sauter; Smith & Hopen, P.A.

(57) ABSTRACT

The present invention provides a method to ensure that distributed resources of a power distribution system remain connected to the circuitry of the power distribution system when a fault occurs at a distributed resource node to assist in identifying the location of the fault by continuing to inject current from the distributed resources into the distribution system, wherein at least one of the distributed resource comprises a controllable voltage source converter.

6 Claims, 5 Drawing Sheets

(56) References Cited

OTHER PUBLICATIONS

Jamali and Talavat. Accurate Fault Location Method in Distribution Networks Containing Distributed Generations. Iranian Journal of Electrical and Computer Engineering. 2011. vol. 10 (No. 1): 27-33.

Tremblay et al., Accurate Fault-Location Technique Based on Distributed Power-Quality Measurements. C I R E D 19th International Conference on Electricity Distribution. Vienna, May 21-24, 2007: 1-4.

* cited by examiner

METHOD OF LOCATING A FAULT IN A POWER DISTRIBUTION SYSTEM COMPRISING AT LEAST ONE DISTRIBUTED RESOURCE HAVING A CONTROLLABLE VOLTAGE SOURCE CONVERTER

CROSS REFERENCE TO RELATED APPLICATIONS

This invention claims priority to currently pending U.S. patent application Ser. No. 14/166,467 filed on Jan. 28, 2014 and entitled, "Voltage Profile Based Fault Location Identification System and Method of Use", which claims priority to U.S. Provisional Patent Application No. 61/757,507 filed on Jan. 28, 2013 and entitled, "Voltage Profile Based Fault Identification".

STATEMENT OF GOVERNMENT INTEREST

This invention was made with Government support under Grant No. EEC0812121 awarded by the National Science Foundation. The Government has certain rights in the invention.

FIELD OF INVENTION

This invention relates to a voltage profile based fault location identification system for use in a power distribution system. The voltage profile based fault location identification system includes power electronic converters and employs a short circuit limiting fault current.

BACKGROUND OF INVENTION

The IEEE interconnection standard recommends that the distributed resources (DRs) of a power distribution system be disconnected from the power distribution system when the voltage level falls below a recommended threshold to ensure that the distributed resources do not inject power onto the main power grid of the power distribution system. The IEEE interconnection standard is additionally based on the fact that as the voltage level of the distribution system drops, the distributed resource's voltage reference from the substation may no longer be available or may no longer be accurate.

Identifying the location of a fault in a traditional power system is a challenging task. Electric power only flows in one direction, i.e. from the substation to the various loads. Therefore, when a severe short circuit fault occurs in a distribution system, there is an associated current rise and accompanying voltage sag near the faulted node which extends to every node that is downstream of the faulted node. The fault protection system of a power distribution system currently known in the art responds to the short circuit fault by isolating the assumed faulted nodes and all the downstream nodes of the actual faulted node.

In a power distribution system containing distributed resources, most fault location technologies known in the art ignore the presence of the distributed resources by assuming either low distributed resource penetration or no power injection from the distributed resources during a fault situation. While there are additional fault location technologies known in the art that do consider the presence of distributed resources, these technologies do not consider a current limited system when a fault situation does occur.

Accordingly, what is needed in the art is a system and method for fault location identification in a power distribution system that addresses the presence of distributed resources and provides a current limited system when a fault occurs.

SUMMARY OF THE INVENTION

The present invention provides a method to ensure that distributed resources remain connected to the circuit to assist in the fault location by continuing to inject current in the distribution system. The system contains a plurality of power electronic based converters which convert local direct current (DC) of the distributed resources (DRs) to the power grid alternating current (AC). These converters also have the ability to limit the current in the system when a fault occurs; hence, protecting the system equipment against high fault currents.

In one embodiment of the present invention, a method of identifying the location of a fault in a power distribution system is provided. In the present invention, the power distribution system includes a plurality of distributed resources, and the method includes, injecting, by one or more of the plurality of distributed resources, a current into the power distribution system, generating a voltage profile resulting from the injection of current by the one or more distributed resources and analyzing the voltage profile to identify the location of the fault in the power distribution system.

In an additional embodiment, the present invention provides a system for locating a fault in a power distribution system. The system includes a power distribution system including a plurality of distributed resources coupled to the power distribution system, one or more of the plurality of distributed resources comprising a controllable voltage source converter configured to inject a current into the power distribution system. The system further includes, a voltage profile generator configured for generating a voltage profile resulting from the injection of current by the one or more distributed resources and an analyzer configured for analyzing the voltage profile to identify the location of the fault in the power distribution system.

The invention accordingly comprises the features of construction, combination of elements, and arrangement of parts that will be exemplified in the disclosure set forth hereinafter and the scope of the invention will be indicated in the claims.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

Figure 1:
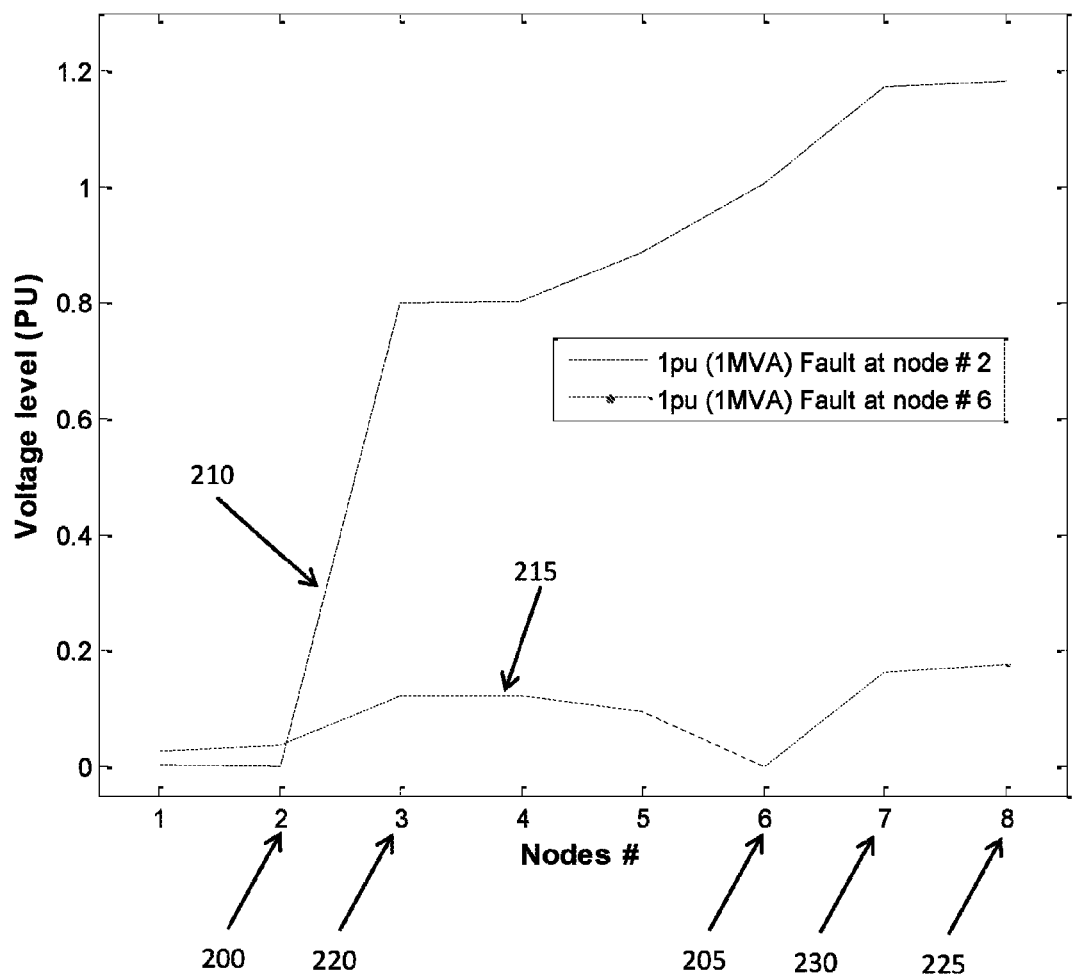
FIG. 1 is a voltage profile for a fault at node 2 and node 6 in a distribution system containing distributed resources in accordance with an embodiment of the present invention.

Modern power distribution systems include distributed resources that provide local power generation and are connected to the power distribution system. Such local power generation sources include photovoltaic (PV) systems, wind systems and microturbines. The number and diversity of these local power generation sources is rapidly increasing. As the number of local power sources connected to an existing power distribution system rises, the distribution system fault location methods currently known in the art have become increasingly inadequate. Reasons for the increasing inadequacy of the current fault location methods include unreasonable cost of the system, system complexity (mesh-like topology) and bidirectional power flow in the distribution system that is not addressed by the current fault location methodologies.

The fault location identification system of the present invention takes advantage of the existing topology of the power distribution system. The fault location identification includes controllable voltage source converters (VSCs) to assist in the location of the fault and alters the voltage profile of the system in the presence of a fault condition. Utilizing controllable voltage source converters to locate the fault reduces miss-trips of the circuit breakers that result when relying on the measured voltage when there is no electrical supply in a section of the distribution system as a result of a fault. The incorporation of controllable voltage source converters in the fault location identification system will serve to boost the voltage of the distribution system, locate the fault and provide rapid restoration of the distribution system.

Power distribution system currently known in the art do not employ controllable voltage source converters and the voltage on a feeder associated with the distributed resource is expected to decrease as the distance between the distributed resource and the power distribution system increases. In accordance with the present invention, if the distributed resources in the power distribution system are allowed to inject power, the voltage profile of the system will change as shown in FIG. 2 for the prior art system and FIG. 1 for the fault location identification system of the present invention.

When a severe short circuit fault occurs in a distribution system, there is an associated current rise and accompanying voltage sag near the faulted node which extends to every node that is downstream of the faulted node. The fault protection system of a power distribution system currently known in the art responds to the short circuit fault by isolating the assumed faulted nodes and all the downstream nodes of the actual faulted node. As shown in the graph of FIG. 2, when a fault occurs in a prior art fault location identification system, the voltage profile resulting from the fault will provides very limited information regarding the location of the fault. For example in the prior art system, when a fault occurs at node 2 100, in both the 1 MVA 105 and 12 MVA 110 cases, the distributed resources at nodes 2 100 through 8 125 will be disconnected from the power distribution system by the fault protection system of the power distribution system. Similarly, a fault at node 6 130 will result in the distributed resources at nodes 6 130 through 8 125 being isolated from the rest of the system.

Figure 2:
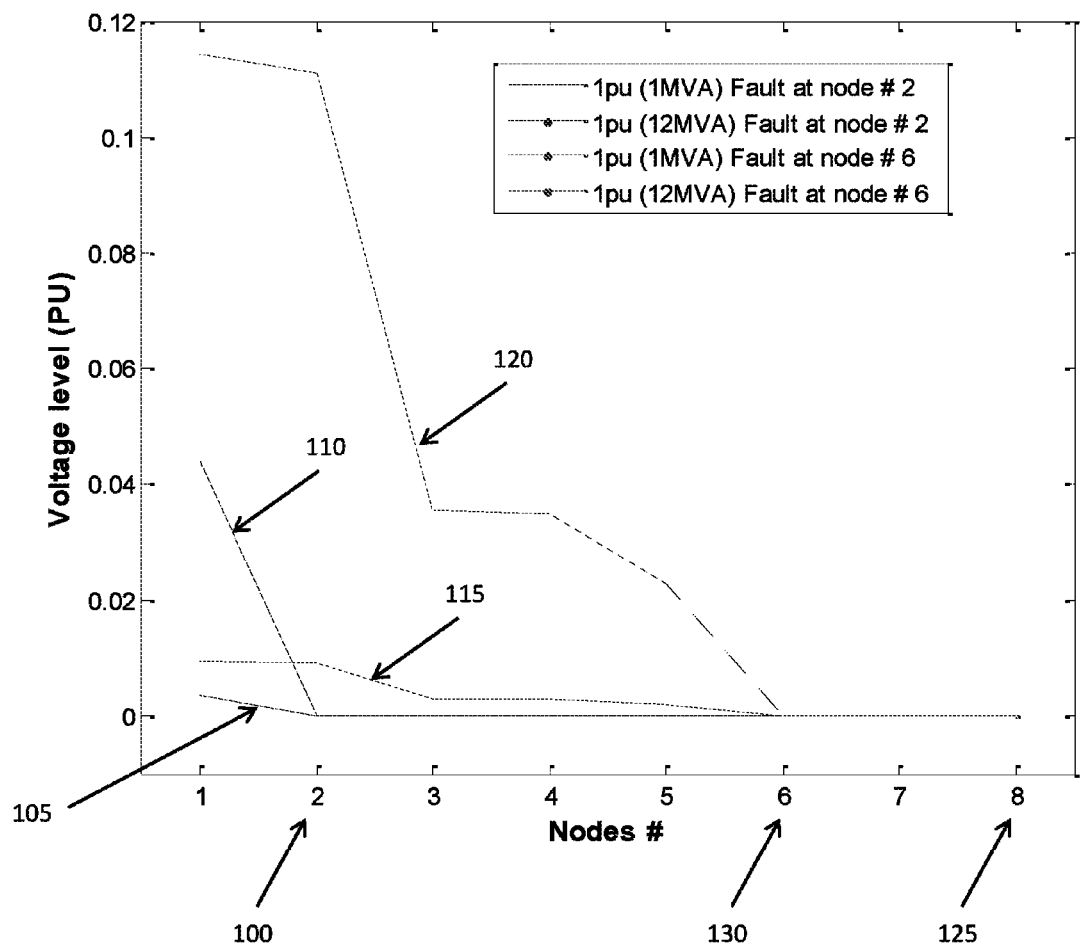
FIG. 2 is a voltage profile for a fault at node 2 and node 6 in a traditional distribution system, wherein the system contains no distributed resources or they are disconnected during the fault in accordance with an embodiment of the present invention.

In contrast, as shown in the graph of FIG. 1, the voltage profile resulting from a fault in accordance with the fault location identification system of the present invention identifies the fault at either node 2 200 or node 6 205. For example, when a fault occurs at node 2 200, it is seen that the voltage level 210 drops at node 2 200, but the voltage level at nodes 3 220 through 8 225 is maintained by the use of the controlled voltage source converters at each of the distributed resources associated with each of nodes 3 220 through 8 225. Additionally, when a fault occurs at node 6 205, it is seen that the voltage level 215 drops at node 6 205, but the voltage level at nodes 7 230 through 8 225 is maintained by the use of the controlled voltage source converters at each of the distributed resources associated with each of nodes 7 230 through 8 225. As such, the voltage profile provided by the fault location identification system of the present invention results from the injection of current from all the distributed resource at each of the nodes in the system using the controllable voltage source converters.

Figure 3:
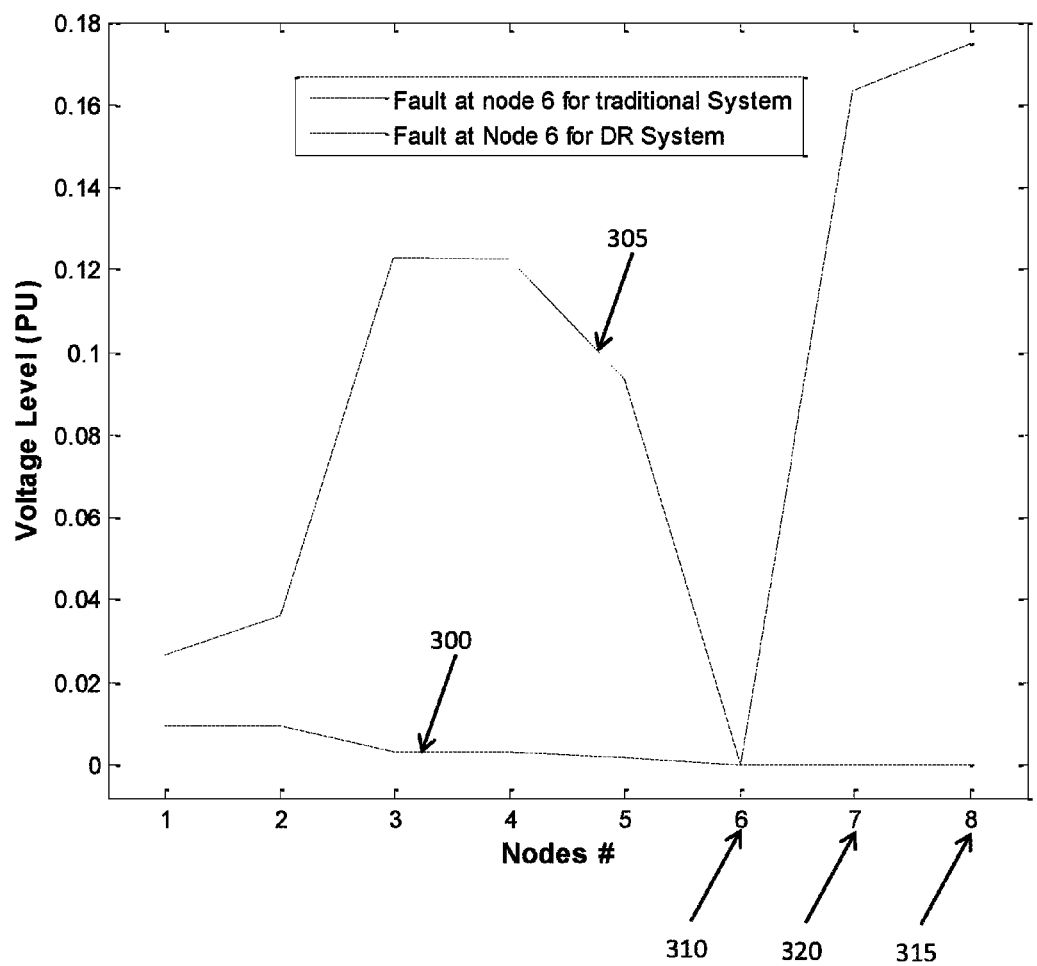
FIG. 3 is voltage profile for a fault at node 6 in a traditional distribution system and one containing distributed resources in accordance with an embodiment of the present invention.

FIG. 3 illustrates the difference in the voltage profiles of a prior art fault location system and the fault location identification system employing multiple distributed resource with controllable voltage source converters achieved by the present invention. As shown, when a fault occurs at node 6 310 in the prior art system, the voltage level drops at nodes 6 310 through 8 315, in contrast, with the fault location identification system of the present invention, when a fault occurs at node 6 310, the voltage level at node 7 320 through 8 315 is maintained by the controllable voltage source converters of the distributed resources at these nodes. As such, the voltage profile for a distributed resource system utilizing the fault location identification system of the present invention clearly indicates the fault at node 6 310 in the system of the present invention, whereas the fault is not clearly identified in the prior art system.

Figure 4:
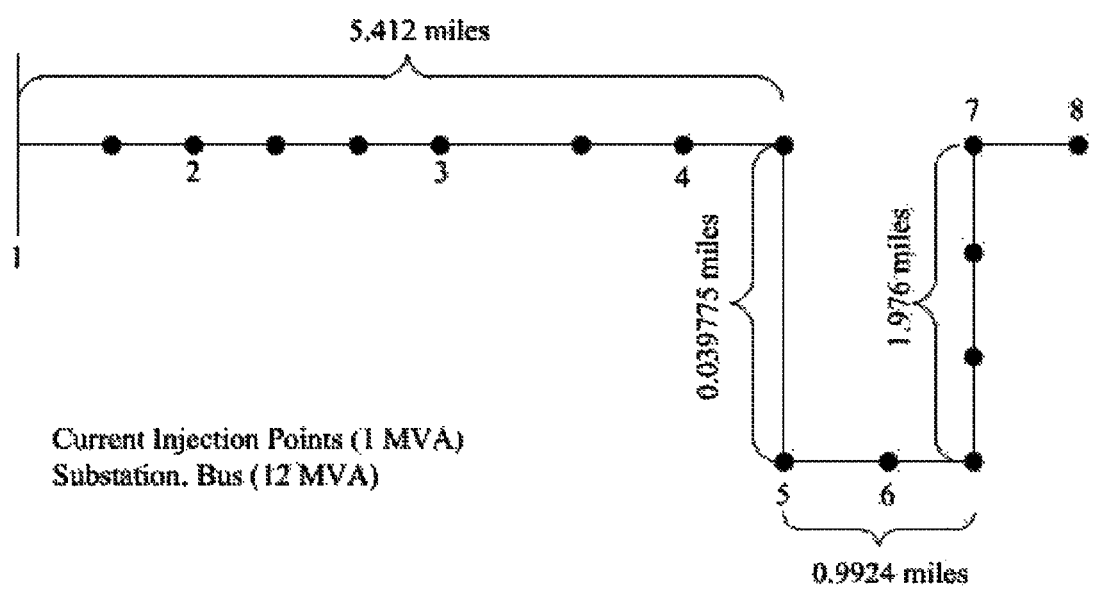
FIG. 4 is a schematic of a test system 11.9 kV (8 nodes) in accordance with an embodiment of the present invention.

FIG. 4 is a schematic illustrating an exemplary embodiment of the present invention that was used to generate the graphs shown in FIGS. 1-3. The physical distance between two adjacent distributed resource nodes will also determine if the faulty node can be located accurately. To get an accurate voltage profile for a power distribution system, it is necessary to measure the voltage at multiple nodes in the system. However, making measurements at the nodes is difficult in the prior art systems because there are limited nodes at which a voltage measurement can be performed. In contrast, in the fault location identification system of the present invention which includes a plurality of distributed resources and a controllable voltage source converter associated with each of the distributed resources, each controllable voltage source converters can serve as a measurement unit at which voltage measurement can be performed and used to generate an accurate voltage profile. As shown in FIG. 4, each of the nodes 1-8 are positioned at varying distances from the distribution grid. It is known that the voltage level naturally decreases the farther the node is away from the distribution grid. In the present invention, the controllable voltage source converters at each of the nodes are used to inject current into the power distribution system thereby providing the system with a means for measuring the voltage level at each of the nodes. Knowing the distances between the nodes will improve the accuracy of the fault location identification system of the present invention.

The voltage profile of the power distribution system changes when a fault occurs in the system and the location of the observed voltage drop in the voltage profile is closely related to the location of the fault. Furthermore, most distributed resources provide DC voltage. Therefore, in a DC system, controllable voltage source converters can modulate an AC signal on top of the DC signal and that modulated AC signal profile may be used to locate the fault similarly to the AC system.

Figure 5:
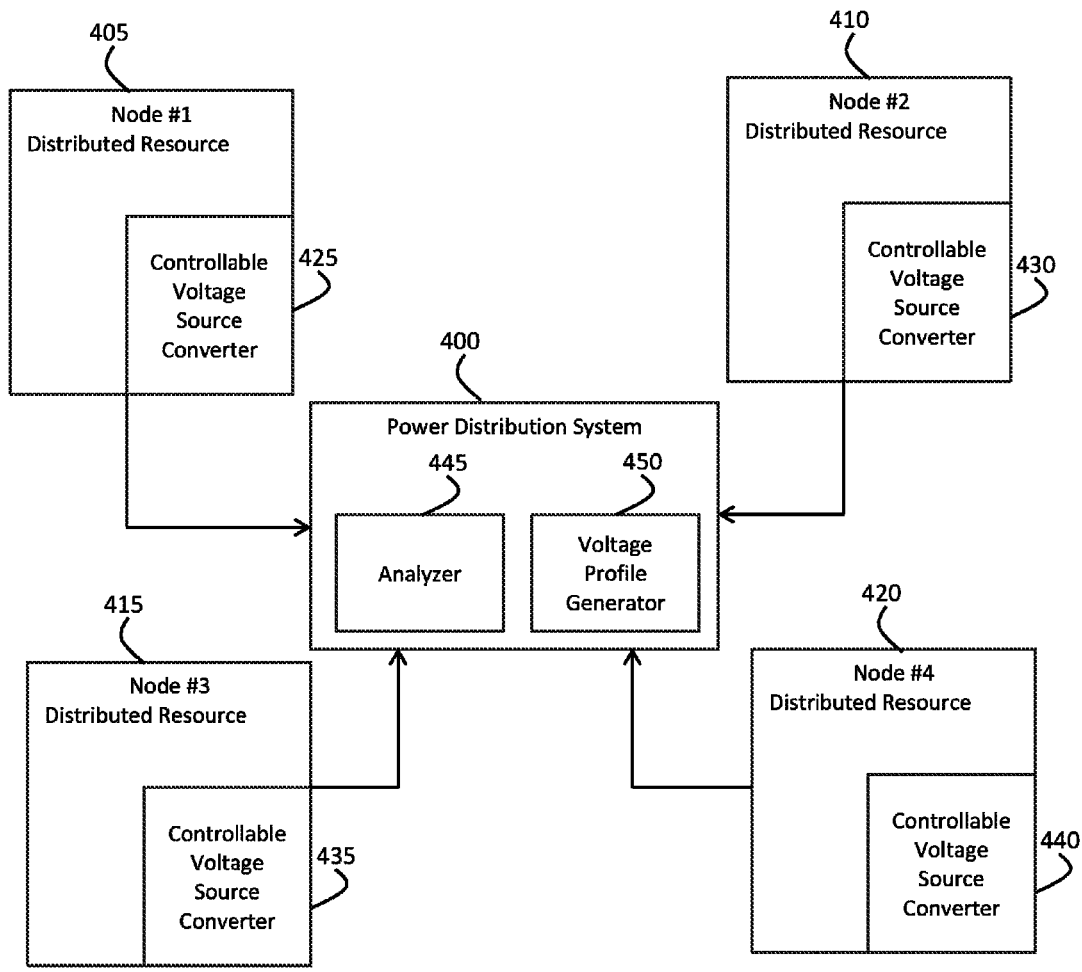
FIG. 5 is a block diagram illustrating a fault location identification system in accordance with an embodiment of the present invention.

In an exemplary embodiment, as illustrated with reference to FIG. 5, the fault location identification system of the present invention includes a power distribution system 400 and a plurality of distributed resources 405, 410, 415, 420 coupled to the power distribution system 400. One or more of the plurality of distributed resources 405, 410, 415, 420 comprising a controllable voltage source converter 425, 430, 435, 440 configured to inject a current into the power distribution system 400. The power distribution system 400 further includes, a voltage profile generator 450 configured for generating a voltage profile resulting from the injection of current by the one or more distributed resources 405, 410, 415, 420 and an analyzer 445 configured for analyzing the voltage profile to identify the location of the fault in the power distribution system 400.

It will be seen that the advantages set forth above, and those made apparent from the foregoing description, are efficiently attained and since certain changes may be made in the above construction without departing from the scope of the invention, it is intended that all matters contained in the foregoing desctiption or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall therebetween.

What is claimed is:

1. A method of identifying the location of a fault in a power distribution system, the method comprising:

in response to a fault located at one of a plurality of distributed resources on one or more feeders of a power distribution system comprising a distribution grid, wherein each of the one or more feeders comprises the plurality of distributed resources, wherein at least one of the plurality of distributed resources not located at the fault on the feeder comprises a controllable voltage source converter, and wherein a distance of each of the plurality of distributed resources relative to the distribution grid is known, and generating a current to be injected into the power distribution system by the controllable voltage source converter of the at least one distributed resource not located at the fault on the feeder and injecting, by the one or more of the plurality of distributed resources not located at the fault on the feeder, the current into the power distribution system;

measuring a voltage level at each of the plurality of distributed resources resulting from the current injected into the power distribution system by the controllable voltage source converter of the at least one distributed resource not located at the fault on the feeder; generating a voltage profile from the voltage measurements at each of the one or more distributed resources, wherein the voltage profile comprises the voltage level at each of the plurality of distributed resources relative to the distance of each of the plurality of distributed resources from the distribution grid of the power distribution system; and analyzing the voltage profile to identify the location of the fault in the power distribution system, wherein analyzing the voltage profile further comprises identifying a voltage drop at one of the plurality of distributed resources located at a first distance from the distribution grid and a corresponding voltage rise at one or more of the plurality of distributed resources located at a second distance from the distribution grid, wherein the second distance is greater than the first distance.

2. The method of claim 1, wherein the one or more distributed resources is a DC voltage distributed resource providing a DC signal.

3. The method of claim 2, further comprising, modulating, by the controllable voltage source converter of the distributed resource, an alternating current (AC) signal on top of the direct current (DC) signal of the distributed resource.

4. The method of claim 1, further comprising maintaining an electrical connection between a first distributed resource of the plurality of distributed resources and the power distribution system when the fault is at the location of the first distributed resource.

5. The method of claim 1, further comprising, isolating the identified fault in the power distribution system.

6. The method of claim 1, wherein at least one of the plurality of distributed resources is selected from the group consisting of a wind turbine, microturbine, solar panels and cogeneration resources.

* * * * *